United States Patent
Baros et al.

(10) Patent No.: US 7,099,016 B2
(45) Date of Patent: Aug. 29, 2006

(54) METHOD AND APPARATUS FOR ZERO-MIXING SPECTRUM ANALYSIS

(75) Inventors: Pavel Baros, Hrusorany (CZ); Leo Brueckner, Brno (CZ); Rudolf Reckziegel, Dresden (DE); Reiner Hausdorf, Ottobrunn (DE)

(73) Assignee: Rohde Schwarz GmbH & Co. KG, (DE)

(*) Notice: Subject to any disclaimer, the term of this patent is extended or adjusted under 35 U.S.C. 154(b) by 270 days.

(21) Appl. No.: 10/495,187

(22) PCT Filed: Jan. 16, 2003

(86) PCT No.: PCT/EP03/00412

§ 371 (c)(1),
(2), (4) Date: May 11, 2004

(87) PCT Pub. No.: WO03/069359

PCT Pub. Date: Aug. 21, 2003

(65) Prior Publication Data

US 2004/0251888 A1   Dec. 16, 2004

(30) Foreign Application Priority Data

Feb. 11, 2002   (EP) ................................. 02002099

(51) Int. Cl.
    *G01B 9/02*   (2006.01)

(52) U.S. Cl. ...................................... 356/484; 356/451

(58) Field of Classification Search ................ 356/451, 356/484
See application file for complete search history.

(56) References Cited

U.S. PATENT DOCUMENTS

| 5,736,845 A | 4/1998 | Kosuge |
| 5,869,959 A * | 2/1999 | Tomikawa ............... 324/76.27 |
| 6,275,020 B1 | 8/2001 | Nagano |
| 6,445,327 B1 * | 9/2002 | Kishi .......................... 341/155 |
| 6,486,958 B1 * | 11/2002 | Szafraniec et al. ......... 356/484 |
| 2005/0068533 A1 * | 3/2005 | Gurunathan et al. ........ 356/402 |

FOREIGN PATENT DOCUMENTS

| EP | 0 244 071 A1 | 11/1987 |
| EP | 0 565 479 A1 | 10/1993 |

* cited by examiner

*Primary Examiner*—Hwa (Andrew) Lee
*Assistant Examiner*—Patrick Connolly
(74) *Attorney, Agent, or Firm*—Christensen O'Connor Johnson Kindness PLLC

(57) ABSTRACT

An apparatus (1) for analyzing a spectrum of an input signal (x(t)) having at least one line with a center frequency ($\omega_s$) comprises a mixer (2) for zero-mixing the input signal (x(t)) to produce a base band signal (z(t)) by sweeping a local oscillator frequency ($\omega_s$) generated by a local oscillator (3) and a resolution filter (4) for filtering the base band signal (z(t)) to produce a filtered base band signal (y(t)). Detector means (7) detects the time of occurrence ($t_i$), the duration ($\Delta T_i$) and the maximum value ($y'_i$) of several halfwaves of the filtered base band signal (y(t)). Envelope reconstruction means (6) reconstructs the envelope ($E(\omega)$) of the spectrum of the input signal (x(t)) by using an estimated amplitude at an estimated center frequency of each line of the input signal (x(t)). The estimated center frequency and the estimated amplitude are calculated from the time of occurrence ($t_i$), the duration ($\Delta T_i$) and the maximum value ($y'_i$) detected by the detector means (7) from the several halfwaves of the filtered base band signal (y(t)).

9 Claims, 5 Drawing Sheets

METHOD AND APPARATUS FOR ZERO-MIXING SPECTRUM ANALYSIS

The invention concerns a method and an apparatus for zero-mixing spectrum analysis.

For example from U.S. Pat No. 5,736,845 a spectrum analyzer with two step down conversion to the base band is known. In a first down conversion stage with a variable first local oscillator and a first mixer the input signal is transferred to an intermediate frequency. At a second stage with a constant second local oscillator and a second mixer the intermediate frequency is transferred to the base band. This configuration of spectrum analyzer is widely used. However, the two mixer stages are costly and thus it is desirable to have a spectrum analyzer with only one mixer stage. Such a concept is known as zero-mixing concept, which means that the input signal is directly converted to the base band.

The problem in frequency spectrum analyzers using the zero-mixing concept is the problem that surging occurs when the local oscillator frequency approaches the center frequency of one of the lines within the input signal. The envelope of the spectrum of the input signal has to be reconstructed. The central peak, i. e. the amplitude of the signal beyond the resolution filter when the frequency of the local oscillator equals one of the center frequencies of the lines of the input signal, strongly depends on the phase difference between the input frequency component and the sweep signal of the local oscillator. Thus no linear interpolation can reconstruct the spectrum envelope near the central peak. Therefore, the zero-mixing concept could not be used with sufficient accuracy in the past.

It is the object of the present invention to propose a method for analyzing a spectrum of an input signal and a respective apparatus, applying the zero-mixing concept with a high accuracy and with low cost components.

The object is solved by the features of claim 1 concerning the method and by the features of claim 9 concerning the apparatus.

It is the basic idea of the present invention to reconstruct the envelope of the spectrum of the input signal using an estimated amplitude at an estimated center frequency of each line of the input signal, whereby the estimated amplitude and the estimated center frequency are calculated from the time of occurrence, the duration and the maximum value of several halfwaves (wavelets) of the filtered base band signal. In the vicinity of the center frequency of one of the lines of the input signal, the signal outputted from the resolution filter is a surging signal which can be divided into several halfwaves (wavelets). For several halfwaves (wavelets) in the vicinity of the center frequency (when the frequency of the local oscillator approaches or leaves the center frequency) the time of occurrence, the duration and the maximum value of each halfwave are evaluated. It has been found that from the time of occurrence, the duration and the maximum value of several halfwaves an estimated center frequency and an estimated amplitude at the center frequency can be calculated with high accuracy. If the center frequency and the amplitude at the center frequency of each line of the input signal are known, the envelope of the input signal can be reconstructed near the center frequency with high accuracy and high reliability.

Claims 2 to 8 concern further developments of the inventive method.

Formulas for calculating an estimated value for the center frequency and for calculating an estimated amplitude value at the center frequency for each halfwave individually based on the time of occurrence, the duration and the absolute maximum value of the respective halfwave are given in claims 2 and 3, respectively.

After having obtained an estimated value for the center frequency and an estimated amplitude value at the center frequency for each evaluated halfwave (wavelet), the values resulting from the different halfwaves (wavelets) have to be averaged. According to claim 4 only the values resulting from halfwaves (wavelets) falling in intervals having a minimum number of counts are used for averaging. According to claim 5 the intervals are preferably overlapping.

When reconstructing the envelope of the spectrum, in a first frequency range around the center frequency, the envelope is preferably reconstructed by using the frequency response of the resolution filter fitted with the estimated center frequency and the estimated amplitude at the center frequency according to claim 6. In a second frequency range far from the center frequency the envelope of the spectrum is preferably reconstructed by using the absolute maximum values of the filtered base band signal according to claim 7. In an intermediate frequency range a contribution of both methods is preferably used with weighting functions leading from the first frequency range smoothly to the second frequency range according to claim 8.

The concept and the advantages of the present invention can be better understood from an embodiment of the invention which is explained with reference to the drawing. In the drawing FIG. 1 shows a block diagram of the inventive zero-mixing spectrum analyzer;

Figure 5:
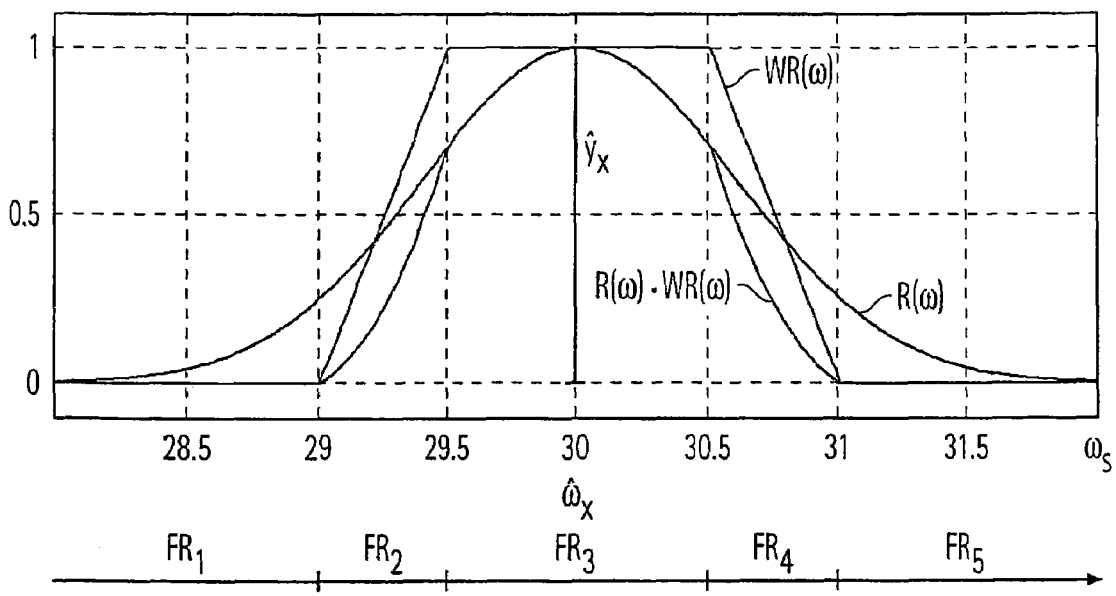
Figure 6:
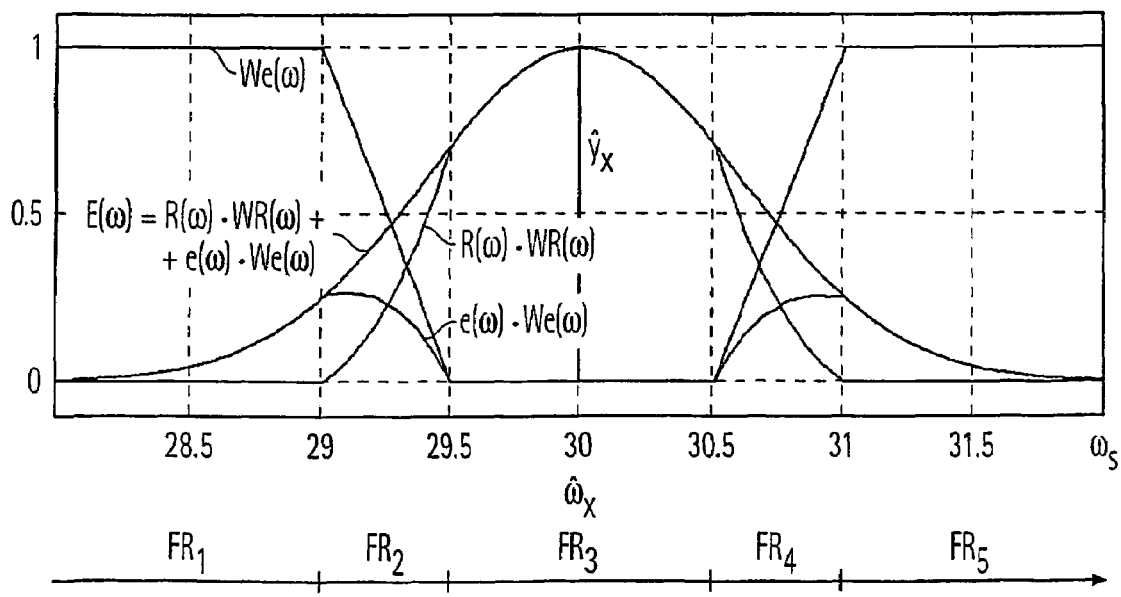

FIG. 5 shows the frequency response of the resolution filter $R(\omega)$, the weighting function $WR(\omega)$ of the frequency response of the resolution filter and the product $R(\omega)\cdot WR(\omega)$ and FIG. 6 shows the weighting function $We(\omega)$ of the envelope obtained from the maxima of the filtered base signal of the resolution filter, the products $e(\omega)\cdot We(\omega)$, $R(\omega)\cdot WR(\omega)$ and the resulting envelope $E(\omega)=R(\omega)\cdot WR(\omega)+e(\omega)\cdot We(\omega)$.

Figure 1:
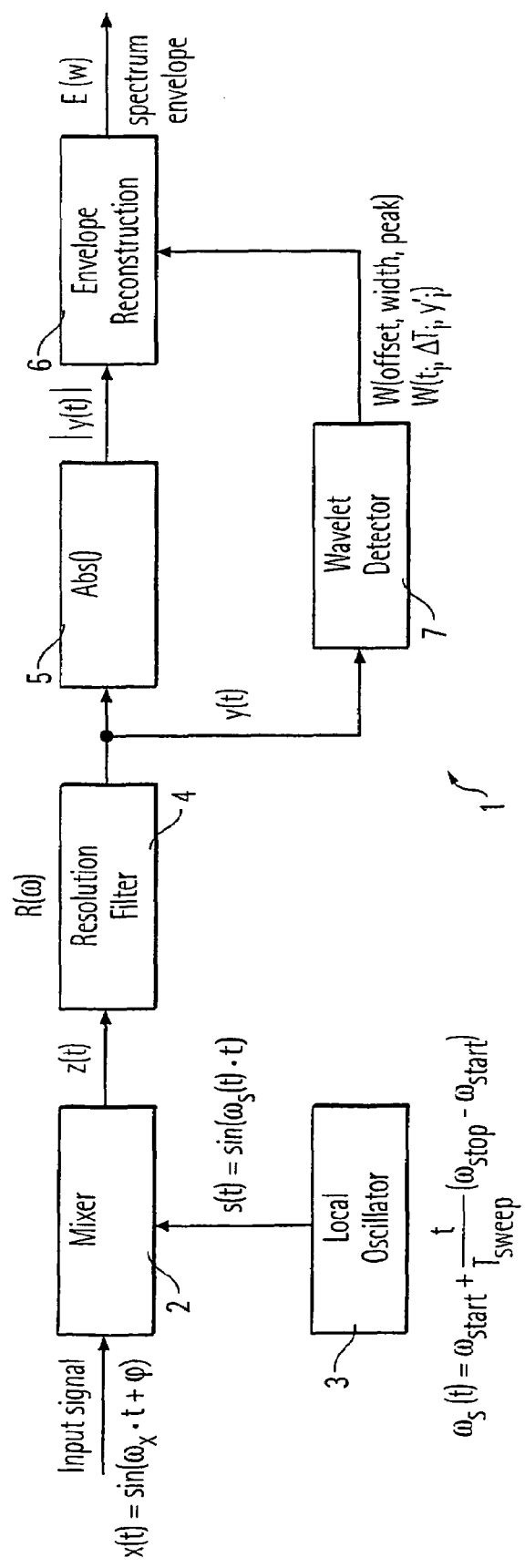

FIG. 1 shows a block diagram of the inventive apparatus 1 for zero-mixing spectrum analysis. An input signal x(t), which has to be analyzed, is provided to a mixer 2. To facilitate the description of the present invention it is assumed that the input signal is a sinus-signal having only one circle frequency $\omega_x$. The input signal can thus be expressed as $$x(t) = \sin(\omega_x \cdot t + \phi) \quad (1)$$

In general, however, the input signal is a superposition of several spectral lines. For each spectral line of the spectrum of the input signal there is a center frequency $\omega_{x,i}$. For the present simplified case there is only one center frequency $\omega_x$. $\phi$ is a phase shift with respect to the signal s(t) provided by a local oscillator 3 and fed to mixer 2. The signal s(t) of the local oscillator 3 can be expressed as a function of time t as follows:

$$s(t) = \sin(\omega_s(t) \cdot t) \quad (2)$$

The circle frequency $\omega_s$ of the local oscillator 3 is not constant but a function of time t as the local oscillator is swept from a start circle frequency $\omega_{start}$ to a stop circle frequency $\omega_{stop}$ within the sweep time $T_{sweep}$. The actual circle frequency $\omega_s(t)$ of the local oscillator 3 can be expressed as a function of time t as follows:

$$\omega_s(t) = \omega_{start} + \frac{t}{T_{sweep}} (\omega_{stop} - \omega_{start}) \quad (3)$$

As already explained in the opening part of the description, the present invention is related to the zero-mixing concept. This means that mixer 2 does not convert the input signal x(t) to an intermediate frequency, but the input signal x(t) is directly converted to the base band. Base band signal z(t) is transferred to the resolution filter 4 having the resolution filter frequency response R($\omega$).

The output signal y(t) of the resolution filter 4 is transferred to absolute value means 5, which outputs the absolute values |y(t)| of the filtered base band signal y(t). The absolute values of the filtered base band signal |y(t)| are transferred to envelope reconstruction means 6 for reconstructing the spectrum envelope E($\omega$) of the input signal.

However, only on the basis of the absolute values of a filtered base band signal |y(t)| would the reconstruction of the envelope be rather inaccurate in the vicinity of the center frequency $\omega_x$, which will be explained later on with respect to FIGS. 2 and 3. Thus, according to the invention, detector means 7 is connected to the output of the resolution filter 4 and is provided with the filtered base band signal y(t). Detector means 7 detects the time of occurrence $t_i$ (offset), the duration $\Delta T_i$ (width) and the maximum absolute value $y'_i$ (peak) of several halfwaves (wavelets) of the filtered base band signal y(t). This data are fed to envelope reconstruction means 6 and used for spectrum envelope reconstruction in the vicinity of the center frequency $\omega_x$ as will be explained in detail later on.

For a better understanding of the problem solved by the present invention FIGS. 2A, 2B, 3A and 3B show the absolute values |y| of the filtered base band signal y as a function of the actual frequency $\omega_s$ of the sweep signal s. As, according to equation (3), the actual frequency $\omega_s(t)$ of the sweep signal s is a linear function of time t, FIGS. 2A to 3B at the same time show the signal y as a function of time of measurement t.

Figure 2A:
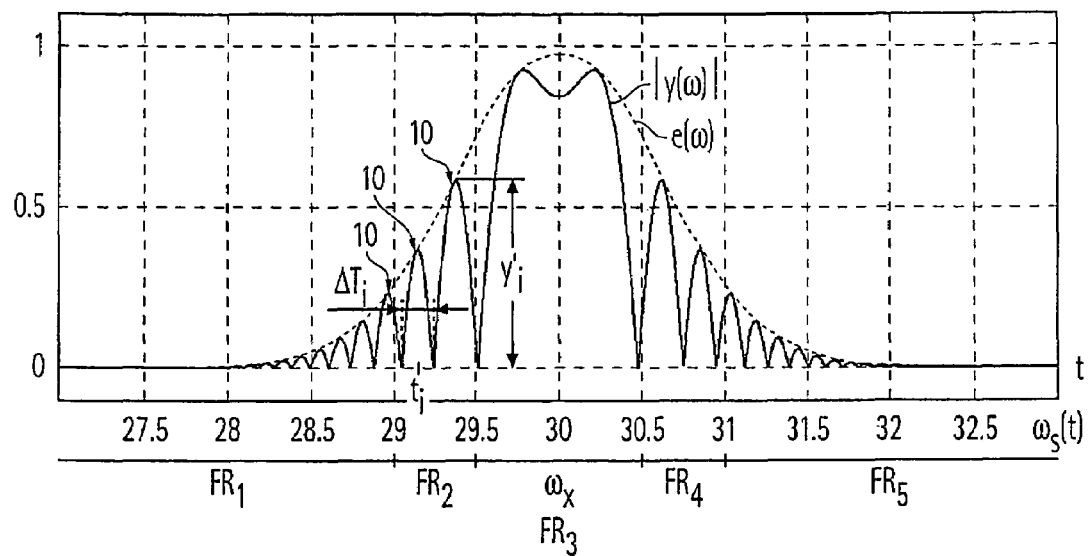
FIG. 2A shows the signal beyond the resolution filter and the spectrum envelope reconstructed only on the basis of the filtered base signal for a fast sweep and a phase difference between the input signal and the sweep signal of the local oscillator of $\phi=0.2\pi$.
Figure 2B:
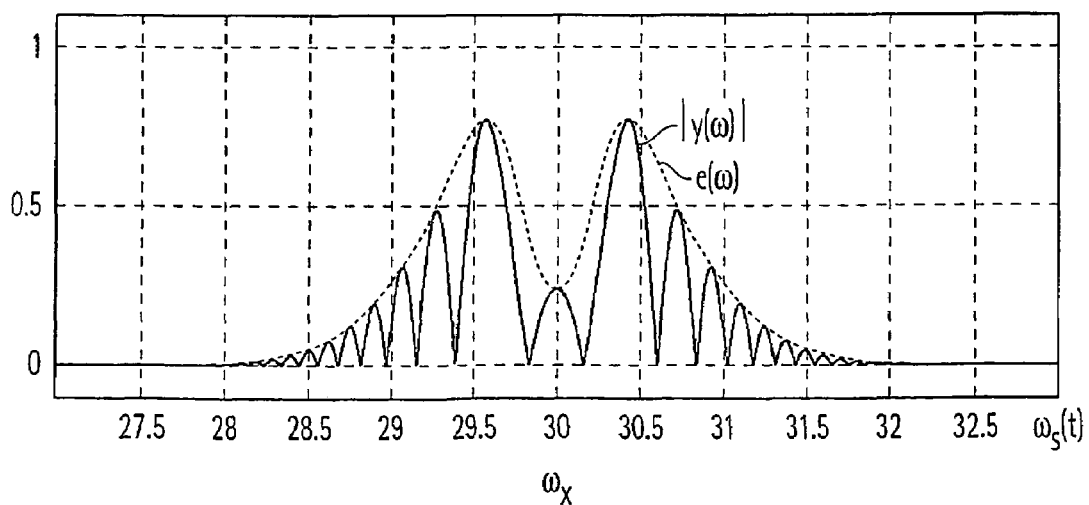
FIG. 2B shows the signal beyond the resolution filter and the spectrum envelope reconstructed only on the basis of the filtered base signal for a fast sweep and a phase difference between the input signal and the sweep signal of the local oscillator of $\phi=0.6\pi$.

FIGS. 2A and 2B show a fast sweep measurement, i. e. the total sweep time $T_{sweep}$ in equation (3) is rather short. The total sweep time $T_{sweep}$ is the same for FIGS. 2A and 2B, but for FIG. 2A the phase difference $\phi$ between the input signal x and the sweep signal s is $\phi = 0.2\pi$ and for FIG. 2B the phase difference $\phi$ between the input signal x and the sweep signal s is $\phi = 0.6\pi$. It can be obtained from FIGS. 2A and 2B that a surging occurs when the actual frequency $\omega_s(t)$ approaches the center frequency $\omega_x$ or leaves the center frequency $\omega_x$ of the input signal. The surging frequency is the actual frequency $\omega_y$ of the filtered base band signal y(t). The relation between the actual circle frequency $\tilde{\omega}_{y,i}$ for halfwave (wavelet) i, the actual frequency $\omega_s$ at time of occurrence $t_i$, when halfwave (wavelet) i occurs, and the center frequency $\omega_x$ of the input signal can be expressed as follows:

$$\omega_x = \omega_s(t=t_i) + \tilde{\omega}_{y,i} \quad \text{sweep is approaching } \omega_x \quad (4)$$

$$\omega_x = \omega_s(t=t_i) - \tilde{\omega}_{y,i} \quad \text{sweep is leaving } \omega_x \quad (5)$$

The equation (4) is true when the sweep is approaching center frequency $\omega_x$ ($\omega_s < \omega_x$). Equation (5) is true when the sweep is leaving $\omega_x$ ($\omega_s > \omega_x$).

An attempt can be made to reconstruct the envelope of the spectrum of the input signal by fitting an envelope function e($\omega$) through the absolute maxima $y'_i$ of the absolute values |Y| of the filtered base band signal y as shown in FIGS. 2A and 2B. This reconstruction method is successful in a frequency range $FR_1$ and $FR_5$ far from the center frequency $\omega_x$ of the input signal. However, in the vicinity of the center frequency $\omega_x$ this approach is not successful as the peaks of the absolute values |y| of the filtered base band signal y near the center frequency $\omega_x$ strongly depend on the phase difference $\phi$ between the input signal x and the sweep signal s. This can be seen by comparing FIG. 2A and FIG. 2B. As already mentioned the phase difference $\phi$ is $\phi = 0.2\pi$ in FIG. 2A and $\phi = 0.6\pi$ in FIG. 2B. In the case of FIG. 2B a small maximum occurs at the center frequency $\omega_x$ leading to a minimum of curve e($\omega$). Thus this approach is totally unreliable in the frequency range $FR_3$ and cannot be used as a single method in frequency ranges $FR_2$ and $FR_4$. Only in frequency ranges $FR_1$ and $FR_5$ can this method be used.

Figure 3A:
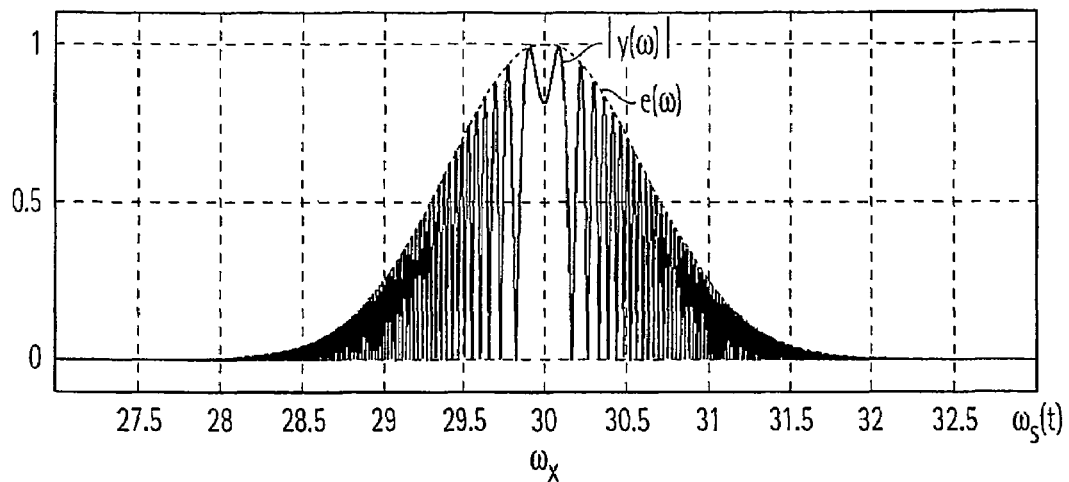
FIG. 3A shows the signal beyond the resolution filter and the spectrum envelope reconstructed only on the basis of the base signal for a slow sweep and a phase difference between the input signal and the sweep signal of the local oscillator of $\phi=0.2\pi$.
Figure 3B:
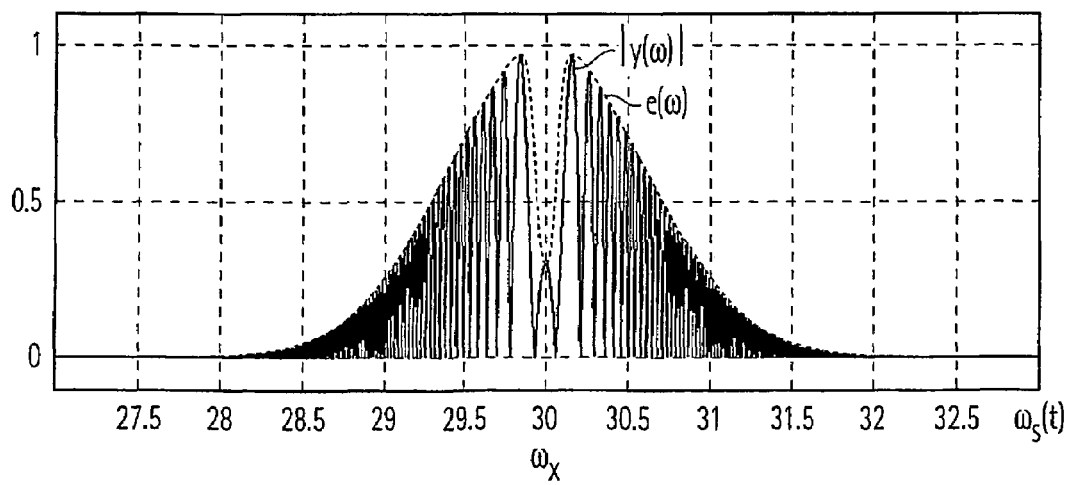
FIG. 3B shows the signal beyond the resolution filter and the spectrum envelope reconstructed only on the basis of the base signal for a fast sweep and a phase difference between the input signal and the sweep signal of the local oscillator of $\phi=0.6\pi$.

The same effect appears to be true for the fast sweep situation shown in FIG. 3A for phase difference $\phi = 0.2\pi$ and shown in FIG. 3B for phase difference $\phi = 0.6\pi$ According to the invention an estimation of the center frequency $\omega_x$ and of the amplitude $y_x$ at the center frequency $\omega_x$ is made on the basis of the time of occurrence ("offset") $t_i$, the duration ("width") $\Delta T_i$ and the maximum absolute value $y'_i$ of at least one, preferably several halfwave(s) (wavelet(s)) i. i is the index of the halfwave $t_i$, $\Delta T_i$ and $y'_i$ are indicated for one of the halfwaves in FIG. 2A.

The duration ("width") $\Delta T_i$ of the halfwave (wavelet) is half of the period and thus is related to the actual frequency $\tilde{\omega}_{y,i}$ of base band signal y by $$\tilde{\omega}_{y,i} = \frac{2\pi}{2 \cdot \Delta T_i} = \frac{\pi}{\Delta T_i} \quad (6)$$

Inserting equation (6) in equations (4) and (5) leads to $$\hat{\omega}_{x,i} = \omega_s(t=t_i) \pm \frac{\pi}{\Delta T_i} \quad (7)$$

An estimated value for the center frequency $\hat{\omega}_{x,i}$ is obtained by equation (7) from the time of occurrence ("offset") $t_i$ and the duration ("width") $\Delta T_i$ for each evaluated halfwave (wavelet) i individually.

Since the resolution filter frequency response R($\omega$) is known, an estimated amplitude value $\hat{y}_{x,i}$ can be obtained from the absolute maximum value (peak) y'$_i$, of the evaluated halfwave (wavelet) i and the duration ("width") $\Delta T_i$ of the evaluated halfwave i by $$\hat{y}_{x,i} = \frac{y'_i}{R(\tilde{\omega}_{y,i})} = \frac{y'_i}{R\left(\frac{\pi}{\Delta T_i}\right)} \quad (8)$$

From formulas (7) and (8) an estimated value of the center frequency $\hat{\omega}_{x,i}$ and an estimated amplitude value $\hat{y}_{x,i}$ at the center frequency are obtained for each evaluated halfwave (wavelet) individually. The different values obtained from the different halfwaves have to be averaged. However, according to a preferred embodiment of the invention, not all values of all evaluated halfwaves are included in the averaging procedure.

Figure 4:
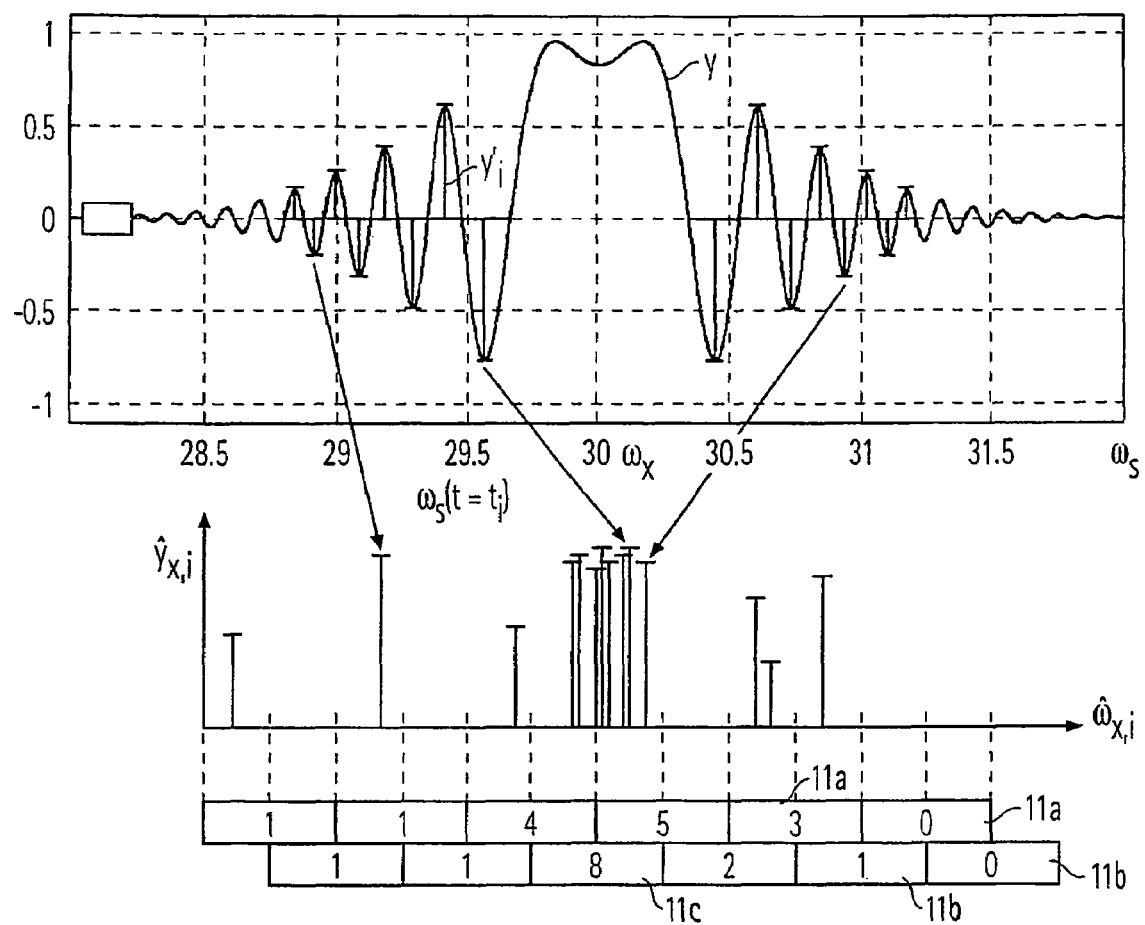
FIG. 4 shows a schematic diagram illustrating the selection of halfwaves (wavelets) used for averaging.

Only the estimated values of distinguished halfwaves (wavelets) are used for averaging. To select the suitable values, the frequency range is divided into intervals 11a, 11b as shown in FIG. 4. Preferably there is a first set of intervals 11a and a second set of intervals 11b, whereby the second set of intervals 11b is overlapping the first set of intervals 11a most preferably by 50%. Each estimated value for the center frequency $\hat{\omega}_{x,i}$ is related to these intervals. Each time $\hat{\omega}_{x,i}$ of a certain halfwave (wavelet) falls into a specific interval, a count is assigned to this interval, i.e. a counter for this interval is incremented. After having related all values $\hat{\omega}_{x,i}$ of all evaluated halfwaves (wavelets) to the intervals 11a, 11b, distinguished intervals are selected which have a minimum number of counts. This threshold of minimum number of counts must be determined experimentally as a fraction of nominal wavelet count (NWC), which is the theoretical maximum of wavelets per classification interval 11a, 11b. A well working minimum number of counts appears to be around 0.9 of the nominal wavelet count.

In FIG. 4 it is shown how the estimated values for the halfwaves (wavelets) are projected into the intervals. The number of counts is indicated for each interval 11a, 11b. In the present example only interval 11c having the highest number of 8 counts is selected for averaging. This means that all estimated values of the center frequency $\hat{\omega}_{x,i}$ and all estimated amplitude values $\hat{y}_{x,i}$ of the selected interval 11c are added and divided by the number of counts n of the selected interval 11c as follows (in the example n=8):

$$\hat{\omega}_x = \frac{1}{n}\sum_{i=1}^{n} \hat{\omega}_{x,i} \quad (9)$$

$$\hat{y}_x = \frac{1}{n}\sum_{i=1}^{n} \hat{y}_{x,i} \quad (10)$$

The remaining step is to reconstruct the spectrum envelope E($\omega$). In the frequency range FR$_3$ around center frequency $\omega_x$ and partly in the frequency ranges FR$_2$ and FR$_4$ the known resolution filter frequency response R($\omega$) is used. FIG. 5 shows the resolution filter frequency response R($\omega$) which has the maximum $\hat{y}_x$ obtained from formula (10) and the estimated center frequency $\hat{\omega}_{x,i}$ obtained from formula (9) as fitting parameters. The resolution filter frequency response R($\omega$) is weighted by a weighting function WR($\omega$), which is also shown in FIG. 5. The weighting function WR($\omega$) equals 1 in the frequency range FR$_3$, equals 0 in the frequency ranges FR$_1$ and FR$_5$ and descends from 1 to 0 in the frequency ranges FR$_2$ and FR$_4$. The resulting function R($\omega$)·WR($\omega$) can be seen from FIG. 5 additionally.

In the frequency ranges FR$_1$ and FR$_5$ far from center frequency $\omega_x$ the envelope e($\omega$) of the spectrum is reconstructed by using the maximum absolute values y'$_i$ of the filtered base band signal y as shown in FIGS. 2A, 2B, 3A and 3B. The respective weighting function for this "original" envelope e($\omega$) equals 1 in the frequency ranges FR$_1$ and FR$_5$, equals 0 in frequency range FR$_3$ and descends from 1 to 0 in frequency ranges FR$_2$ and FR$_4$. The resulting spectrum envelope E($\omega$) is obtained from $$E(\omega)=R(\omega)\cdot WR(\omega)+e(\omega)\cdot We(\omega) \quad (11)$$

and is additionally shown in FIG. 6.

If the input signal x(t) contains more than one spectral line the above described procedure has to be repeated for each spectral line.

To sum up the proposed method uses the waveform of the signal y(t) beyond the resolution filter 4 to gain information necessary for the reconstruction of the spectrum envelope E($\omega$). It can easily be implemented and allows building a spectrum analyzer using the zero-mixing concept with high accuracy.

In the above concept, polarity of a wavelet was assumed by comparing its peak with the peak of a previous wavelet. If it was greater, formula (4) for approaching was used, if it was smaller, formula (5) for leaving was used. The same information can be gained by comparing the width of the wavelet with the previous one. Preferably both of these heuristics are used to achieve the best possible noise resistance.

The invention claimed is:

1. Method for analyzing a spectrum of an input signal (x(t)) having at least one line with a center frequency ($\omega_x$) at the center of the line comprising the following steps:
zero-mixing the input signal (x(t)) to produce a base band signal (z(t)) by sweeping a local oscillator frequency ($\omega_s$), —filtering the base band signal (z(t)) with a resolution filter to produce a filtered base band signal (y(t)), —reconstructing the envelope (E($\omega$)) of the spectrum of the input signal (x(t)) by using an estimated amplitude ($\hat{y}_x$) at an estimated center frequency ($\hat{\omega}_x$) of each line of the input signal (x(t)), whereby the estimated amplitude ($\hat{y}_x$) and the estimated center frequency ($\hat{\omega}_x$) are calculated from the time of occurrence (t$_i$), the duration ($\Delta T_i$) and the maximum value (y'$_i$) of at least one evaluated halfwave of the filtered base band signal (y(t)).

2. Method according to claim 1, characterized in that for each evaluated halfwave i an estimated individual value of the center frequency $\hat{\omega}_{x,i}$ is calculated using the formula:

$$\hat{\omega}_{x,i} = \omega_s(t=t'_i) \pm \frac{\pi}{\Delta T_i}$$

wherein $\omega_s$(t=t'$_i$) is the local oscillator frequency at the time of occurrence t$_i$ of the respective halfwave i and $\Delta T_i$ is the duration of the respective halfwave i.

3. Method according to claim 2, characterized in that for each evaluated halfwave i an estimated individual amplitude value $\hat{y}_{x,i}$ at the center frequency $\omega_x$ is calculated using the formula:

$$\hat{y}_i = \frac{y'_i}{R(\pi/\Delta T_i)}$$

wherein $y'_i$ is the absolute maximum value within the halfwave i and $R(\omega=\pi/\Delta T_i)$ is the frequency response of the resolution filter (4) at $\pi/\Delta T_i$.

4. Method according to claim 3, characterized in that the range of estimated individual values of the center frequency ($\hat{\omega}_{x,i}$) is divided into intervals the estimated individual values of the center frequency ($\hat{\omega}_{x,i}$) of all evaluated halfwaves are related to these intervals giving a count for each estimated value of the center frequency ($\hat{\omega}_{x,i}$) falling within the interval and the estimated individual values of the center frequency ($\hat{\omega}_{x,i}$) and the estimated individual amplitude values ($\hat{y}_{x,i}$) at the center frequency are averaged only for the interval(s) having a minimum number of counts in order to obtain the estimated center frequency ($\hat{\omega}_x$) and the estimated amplitude ($\hat{y}_x$) at the estimated center frequency ($\hat{\omega}_x$).

5. Method according to claim 4, characterized in that the intervals are overlapping.

6. Method according to claim 1, characterized in that in a first frequency range ($FR_3$) around the center frequency ($\omega_x$) the envelope ($E(\omega)$) of the spectrum is reconstructed by using the frequency response ($R(\omega)$) of the resolution filter fitted with the estimated center frequency ($\hat{\omega}_x$) and the estimated amplitude ($\hat{y}_x$) at the center frequency ($\hat{\omega}_x$).

7. Method according to claim 6, characterized in that in at least one second frequency range ($FR_1$, $FR_5$) far from the center frequency ($\omega_x$) the envelope ($E(\omega)$) of the spectrum is reconstructed by using the absolute maximum values ($y'_i$) of each halfwave of the filtered base band signal ($y(t)$).

8. Method according to claim 7, characterized in that in at least one third frequency range ($FR_2$, $FR_4$) between said first frequency range ($FR_3$) and said at least one second frequency range ($FR_1$, $FR_5$) the envelope ($E(\omega)$) of the spectrum is reconstructed by using the frequency response ($R(\omega)$) of the resolution filter fitted with the estimated center frequency ($\hat{\omega}_x$) and the estimated amplitude ($\hat{y}_x$) at the estimated center frequency ($\hat{\omega}_x$) with a first weighting function ($WR(\omega)$) and by using the maximum absolute values ($y'_i$) within each halfwave of the filtered base band signal ($y(t)$) with a second weighting function ($We(\omega)$).

9. Apparatus for analyzing a spectrum of an input signal ($x(t)$) having at least one line with a center frequency ($\omega_x$) at the center of the line comprising:
a mixer for zero-mixing the input signal ($x(t)$) to produce a base band signal ($z(t)$) by sweeping a local oscillator frequency ($\omega_s$) generated by a local oscillator, —a resolution filter for filtering the base band signal ($z(t)$) to produce a filtered base band signal ($y(t)$), —detector means for detecting the time of occurrence ($t_i$), the duration ($\Delta T_i$) and the maximum value ($y'_i$) of at least one halfwave of the filtered base band signal ($y(t)$) and —envelope reconstruction means for reconstructing the envelope ($E(\omega)$) of the spectrum of the input signal ($x(t)$) by using an estimated amplitude ($\hat{y}_x$) at an estimated center frequency ($\hat{\omega}_x$) of each line of the input signal ($x(t)$), whereby the calculated amplitude ($\hat{y}_x$) and the estimated center frequency ($\hat{\omega}_x$) are calculated from the time of occurrence ($t_i$), the duration ($\Delta T_i$) and the maximum value ($y'_i$) detected by the detector means from each evaluated halfwave of the filtered base band signal ($y(t)$).

* * * * *